United States Patent
Cotlet et al.

(10) Patent No.: US 10,971,635 B2
(45) Date of Patent: Apr. 6, 2021

(54) CONDUCTIVE POLYMER NANOWIRES—GRAPHENE HYBRIDS WITH IMPROVED OPTOELECTRONIC PROPERTIES

(71) Applicant: Brookhaven Science Associates, LLC, Upton, NY (US)

(72) Inventors: Mircea Cotlet, Rocky Point, NY (US); Mingxing Li, Huntington Station, NY (US)

(73) Assignee: BROOKHAVEN SCIENCE ASSOCIATES, LLC, Upton, NY (US)

( * ) Notice: Subject to any disclaimer, the term of this patent is extended or adjusted under 35 U.S.C. 154(b) by 0 days.

(21) Appl. No.: 16/443,065

(22) Filed: Jun. 17, 2019

(65) Prior Publication Data
US 2019/0393436 A1 Dec. 26, 2019

Related U.S. Application Data

(60) Provisional application No. 62/688,734, filed on Jun. 22, 2018.

(51) Int. Cl.
*H01L 31/0216* (2014.01)
*H01L 51/42* (2006.01)
*H01L 51/00* (2006.01)
*H01L 31/028* (2006.01)
*H01L 31/0256* (2006.01)

(52) U.S. Cl.
CPC .... *H01L 31/02167* (2013.01); *H01L 51/0036* (2013.01); *H01L 51/0045* (2013.01); *H01L 51/428* (2013.01); *H01L 51/4213* (2013.01); *H01L 31/028* (2013.01); *H01L 2031/0344* (2013.01)

(58) Field of Classification Search
CPC .......... H01L 31/143; H01L 31/147; H01L 31/02167; H01L 31/028; H01L 51/0036; H01L 51/0045; H01L 51/4213; H01L 51/428; H01L 2031/0344
See application file for complete search history.

(56) References Cited

U.S. PATENT DOCUMENTS

2011/0281070 A1* 11/2011 Mittal ................ H01L 31/1884 428/142
2018/0269415 A1* 9/2018 Kobayashi .......... H01L 51/4253

OTHER PUBLICATIONS

Li, Mingxing, Dmytro Nykypanchuk, and Mircea Cotlet. "Improving the Responsivity of Hybrid Graphene-Conductive Polymer Photodetectors via Nanowire Self-Assembly." ACS Photonics 5.11 (2018): 4296-4302.
Kiriy, Nataliya, et al. "One-dimensional aggregation of regioregular polyalkylthiophenes." Nano Letters 3.6 (2003): 707-712.
Ihn, Kyo Jin, Jeff Moulton, and Paul Smith. "Whiskers of poly (3-alkylthiophene) s." Journal of Polymer Science Part B: Polymer Physics 31.6 (1993): 735-742.
Huisman, E. H., et al., "High Gain Hybrid Graphene-Organic Semiconductor Phototransistors" ACS Applied Materials and Interfaces, 2015, vol. 7, pp. 11083-11088.

\* cited by examiner

*Primary Examiner* — Cheung Lee
(74) *Attorney, Agent, or Firm* — Dorene Price

(57) ABSTRACT

A photodetector including graphene and poly(3-hexylthiopene) (P3HT) nanowires is claimed. A method of making the hybrid photodetector is also claimed.

12 Claims, No Drawings

CONDUCTIVE POLYMER NANOWIRES—GRAPHENE HYBRIDS WITH IMPROVED OPTOELECTRONIC PROPERTIES

CROSS-REFERENCE TO RELATED APPLICATION

This application claims the benefit of U.S. Provisional Application No. 62/688,734, filed on Jun. 22, 2018, the entire contents of which are incorporated herein by reference.

GOVERNMENT RIGHTS

This invention was made with Government support under contract number DE-SC0012704 awarded by the U.S. Department of Energy. The Government has certain rights in the invention.

BACKGROUND OF THE INVENTION

Atomically thin graphene is an intriguing low dimensional nanomaterial with unique electronic, mechanical, and optical properties which enable strong light-matter interactions. However, graphene's extremely low absorptivity (2.3%) resulting from its bandgap-less nature, makes this material's applicability in light sensing devices somehow shy. One alternative way to overcome this problem is to combine graphene with strong light-absorbers, for example with colloidal quantum dot (QD) semiconductors or with conductive polymers, materials widely used in organic electronics, including photovoltaics, due to their high absorption cross sections and their ability to be bandgap engineered through chemical synthesis. Poly(3-hexylthiophene) (P3HT) is one such example of a conductive polymer which has been intensely investigated for the development of low cost, highly efficient organic solar cells. Regioregular or rr-P3HT has been recently combined with graphene to develop high gain photodetectors, with P3HT-graphene hybrid photodetectors obtained by spin casting the polymer as a thin film (few tens of nm) on top of graphene. However, there is a need for hybrid photodetectors that promote light scattering and reabsorption of light to provide improved photoresponsivity or optoelectronic response.

SUMMARY OF THE INVENTION

One aspect of the invention relates to a photodetector including graphene and a conductive polymer wherein the conductive polymer is poly (3-hexylthiopene) (P3HT) nanowires. Preferably, the P3HT nanowires form a mesh-like mesostructure on the graphene. The P3HT nanowires may be about 2-4 µm in length. Preferably, the photodetector comprises no planar P3HT thin film.

The graphene is preferably atomically thin. The graphene may have a thickness of about 0.33 nm.

Another aspect of the invention relates to a method of making a hybrid photodetector including: (1) providing regioregular poly (3-hexylthiopene) (P3HT) and atomically thin graphene; (2) either using a Whiskers method or a mixed solvent method to make the regioregular P3HT self-assemble into P3HT nanowires; and (3) either dropping or spin-casting the P3HT nanowires onto the graphene to form a conductive nanowire mesh hybrid photodetector.

In a preferred embodiment, the mixed solvent method is used and the solvents are chlorobenzene and acetone. The regioregular P3HT is dissolved in chlorobenzene to form a solution then heated for at least 3 hours; acetone is added to the solution with stirring to form a mixed solution; and the mixed solution is stirred and heated for at least 10 hours then cooled to room temperature. Preferably, the ratio of chlorobenzene to acetone is about 3:1. The P3HT nanowires are preferably present in the solvent in a concentration of about 0.5 to about 2.5 mg/ml. The solution is preferably heated to about 95° C. and the mixed solution is preferably heated to about 90° C. If spin-casting is used, then the spin-casting preferably occurs at about 1500 rpm to about 2500 rpm.

DETAILED DESCRIPTION

The invention relates to a photodetector with improved optoelectronic properties. The photodetector includes graphene and a conductive polymer.

The conductive polymer is regioregular poly(3-hexylthiopene) (rr-P3HT). rr-P3HT can be casted as a thin film or self-assembled to form nanowires. The invention relates to the rr-P3HT nanowires as the conductive polymer. Rr-P3HT nanowires have high aspect ratio and are formed using the Whiskers method or the mixed solvent method described below. The nanowires are about 2-4 µm in length.

The graphene is atomically thin and preferably used to form a pristine graphene field effect transistor (FET). Pristine graphene FETs may be fabricated by mechanical exfoliation of graphite flakes from a bulk crystal on a $SiO_2$/Si substrate which was used as a dielectric layer and gate electrode.

The P3HT nanowires can be drop or spin cast onto the graphene to form a mesh-like mesostructured or supernanostructure. Drop casting would be similar to sprinkling nanowires on graphene. Spin casting utilizes centrifugal force to uniformly apply the nanowires onto the graphene layer. In either case, the nanowires form a mesh on top of the graphene made from the randomly placed nanowires.

The photodetector preferably contains no planar P3HT thin film as only P3HT nanowires are drop or spin cast on the graphene.

The invention also relates to a method of making the hybrid photodetector described above. The method includes: (1) providing regioregular poly (3-hexylthiopene) (rr-P3HT) and atomically thin graphene; (2) either using a Whiskers method or a mixed solvent method to make the rr-P3HT self-assemble into P3HT nanowires; and (3) either dropping or spin-casting the P3HT nanowires onto the graphene to form a conductive nanowire mesh hybrid photodetector.

The Whiskers methods involves P3HT crystallizing into well-defined, whisker-like forms from supercooled solutions in poor solvents. The solvents include, but are not limited to, cyclohexanone, n-decane, acetone, ethanol and many others. See Journal of Polymer Science, Part B: Polymer Physic 2017, 55, 1075-1087. Crystallization is driven by the strong pi-pi interactions happening perpendicular to the polymer conjugated backbone and by hydrophobic interactions involving the polymer side chains. See Ihn, et al. Whiskers of poly(3-alkylthiophene)s. Journal of Polymer Science Part B: Polymer Physics 1993. 31. 735-742.

The nanowires made from the Whiskers method are about 15 nm wide and >10 µm long. The thickness is estimated to be about 5 nm.

The mixed solvent method works similarly by inducing reconformation and aggregation of the P3HT polymer. See Kiriy, et al. One-Dimensional Aggregation of Regioregular Polyalkylthiophenes. Nano Letters 2003. 3. 707-712. Examples of solvent mixtures include, but are not limited to, chlorobenzene and acetone; chloroform and hexane; and tetrahydrofuran and 1-butanol.

The P3HT nanowires are present in the solvent in a concentration of about 0.5 mg/ml to about 2.5 mg/ml. The P3HT nanowires may also be present in the solvent in the following concentrations, minimum or maximum concentrations, or the values may be combined to create a range of concentrations in mg/ml: 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, and 2.5. For example, the P3HT nanowires may be present in the solvent in a concentration of about 1.0 mg/ml or a range of about 0.8 to about 1.6 mg/ml. The preferred concentration of P3HT nanowires to solvent is about 0.5 mg/ml.

The most preferred solvent mixture is chlorobenzene and acetone. The ratio of chlorobenzene to acetone is roughly 4:1 to 2:1. Most preferably, the ratio of chlorobenzene to acetone is 3:1.

In one embodiment, the regioregular P3HT is dissolved in chlorobenzene to form a solution then heated for at least 3 hours. The solution may be heated to about 90° C., 91° C., 92° C., 93° C., 94° C., 95° C., 96° C., 97° C., 98° C., 99° C., or 100° C. Preferably, the solution is heated to about 95° C.

Then, acetone is added to the solution with stirring to form a mixed solution. The mixed solution is then stirred and heated for at least 10 hours then cooled to room temperature to form the P3HT nanowires. The mixed solution may be heated to about 85° C., 86° C., 87° C., 88° C., 89° C., 90° C., 91° C., 92° C., 93° C., 94° C., or 95° C. Preferably, the mixed solution is heated to about 90° C.

Once the nanowires are formed, they may be drop or spin cast upon the graphene. If spin-casting is used for deposition of the nanowires, the spin-casting occurs at about 1500 rpm to about 2500 rpm.

A list following the word "comprising" is inclusive or open-ended, i.e., the list may or may not include additional unrecited elements. A list following the words "consisting of" is exclusive or closed ended, i.e., the list excludes any element not specified in the list.

The words "consisting essentially of" limit the scope of a claim to the specified materials or steps "and those that do not materially affect the basic and novel characteristic(s)" of the claimed invention. Accordingly, "consisting essentially of" language would limit the photodetector to containing only the claimed conductive polymer and no other conductive polymers in any configuration. For example, if P3HT nanowires are claimed after "consisting essentially of" language, then the presence of thin film rr-P3HT would be excluded.

Examples have been set forth below for the purpose of illustration. The scope of the invention is not to be in any way limited by the examples set forth herein.

EXAMPLES

Example 1

Confirmation of the presence of a single layer graphene was done by micro-Raman spectroscopy where the characteristic G peak at 1603 cm$^{-1}$ and the 2D band at 2690 cm$^{-1}$ were observed and with the two bands featuring an intensity ratio of 2.

Using mechanically exfoliated monolayer graphene, two types of hybrid FETs were built: (1) a graphene-P3HT nanowire mesh FET and (2) a graphene-P3HT thin film FET, with the P3HT nanowire mesh and the P3HT thin film of similar thicknesses as measured by atomic force microscopy (AFM)

Pristine FETs show ambipolar transport which originates from the zero band-gap nature of graphene. They feature Dirac points ($V_D$) located at positive values, around 5V and 24V, respectively, indicating the intrinsic p-type doping of monolayer graphene. Addition of P3HT polymer to single layer graphene FET decreases the value of $V_D$ due to the hole transfer happening from monolayer graphene to the P3HT polymer. The Dirac point decreases to $V_D$=−15V for graphene-P3HT thin film hybrid FET, a change of $\Delta V_D$=−20 V, and down to $V_D$=12 V for graphene-P3HT nanowires hybrid FET, a change of $\Delta V_D$=−12 V. These changes in the Dirac point of graphene with added P3HT suggest that the graphene here has a lower Fermi level than the P3HT polymer. This energy difference between graphene and P3HT helps holes to be transferred from graphene to P3HT to create a built-in field to equilibrate the Fermi level. This is consistent with previous reports on Fermi level for graphene, $E_F$=−4.6 eV and on HOMO and LUMO for P3HT polymer, $E_{HOMO}$=−4.9 eV and $E_{LUMO}$=−3.0 eV, respectively. This type of alignment favors transfer of photogenerated holes from the p-type P3HT to monolayer graphene. Under white light illumination, both hybrid FETs change slightly their Dirac points towards positive voltage direction. This small shift in the Dirac point is caused by the transfer of the photogenerated holes from the polymer to graphene by the built-in field. Simultaneously, residual electrons left in P3HT generate a top gate voltage, modifying the carrier concentration and the conductivity of graphene.

The output characteristics of pristine FETs vs hybrid FETs vs white light illumination power and the influence of polymer morphology (thin film vs nanowire) on the performance of hybrid FET were compared. Small changes in the $I_{DS}$ vs $V_{DS}$ curves with illumination power in all cases were observed. For graphene-P3HT hybrid FETs, a decrease in $I_{DS}$ vs $V_{DS}$ with increased illumination power when compared to pristine FETs was observed. This decrease might reflect a reduction in hole collection following a decrease in the built-in field induced by the increased photo-gating effect at the graphene-P3HT interface. However, an increase in the photoresponse from pristine FETs to hybrid FETs was observed. The relatively small photoresponse of pristine FETs results from the low absorptivity of graphene. Adding P3HT polymer, whether thin film or nanowire mesh, leads to hole doping and increased charge carrier density in graphene. These set of experiments mostly show that the electric properties of the hybrid graphene-P3HT change slightly with polymer morphology (thin film vs nanowire mesh).

To better distinguish the effects of P3HT polymer film morphology on the performance of graphene-P3HT hybrid FETs, e.g. thin film vs nanowire mesh, the ratio of the drain current change, $$\alpha(\%) = \frac{\Delta I_{DS}}{I_{DS(G)}} = \frac{I_{DS(hybrid)} - I_{DS(G)}}{I_{DS(G)}} \times 100\%,$$

vs applied $V_{DS}$ and vs illumination power, with $I_{DS(hybrid)}$ and $I_{DS(G)}$ being drain currents measured from hybrid FET and pristine FET, respectively, were monitored. For the two types of hybrid FETs α(%) vs applied $V_{DS}$ for a $V_G$=30 V and an illumination power of 0.16 mW and α(%) vs applied illumination power for a $V_{DS}$=0.3 V and a $V_G$=30 V were monitored. Both P3HT thin film and P3HT nanowires were spin-casted from solutions of 1 mg/mL polymer concentration at a speed of 2000 rpm, a procedure leading to similar thicknesses. The P3HT thin film increases the drain current with a percentage of about 48%, while the P3HT nanowires mesh increases the drain current with a percentage of about 60%, that is, a 1.2×-1.3× larger drain current compared to P3HT thin film (depending on the applied $V_{DS}$). Similarly, experiments with varying illumination power show increased drain current for both graphene-P3HT hybrid FETs when compared to pristine FETs, on average 45% for the graphene-P3HT thin film FET, 60% for the graphene-P3HT nanowires FET, that is, on average 1.25× larger for the hybrid device with P3HT nanowires vs P3HT thin film. Thus, only by changing the morphology of the deposited polymer, an increase in optoelectronic performance can be achieved.

A dramatic improvement (up to 300%) is observed in the spectral responsivity of the hybrid graphene-P3HT nanowire mesh FET vs the hybrid graphene-P3HT thin film FET and over 3000% vs the pristine graphene FETs. The response of the hybrid FETs to on/off illumination was measured and compared to the response from pristine FETs devices. Similar outperformance of the hybrid graphene-P3HT nanowire FET vs hybrid graphene-P3HT thin film FET (2.5 nA vs 0.8 nA for nanowire vs thin film, >300% increase) and vs pristine FET (2.5 nA vs 0.23 nA, >1000% increase) were observed while clear changes in the response times with on/off illumination, and $\tau_{rise(Graphene)} \approx 750$ MS, $\tau_{rise(Graphene+P3HT\ nanowire)} \approx 550$ ms, and $\tau_{rise(Graphene+P3HT\ thin\ film)} \approx 400$ ms were not observed.

The formation of P3HT nanowires is a consequence of strong interchain π-π stacking driven by the mixed solvent. This strong π-π stacking can lead to the enhancement of both charge transport and light harvesting, which in turn can increase the drain current in the hybrid graphene-P3HT nanowire mesh FET.

Example 2

Graphene-P3HT nanowire mesh FETs using solutions of P3HT of various concentrations, 0.5 mg/mL, 1.0 mg/mL, and 2.5 mg/mL were fabricated to achieve different thicknesses and nanowire densities for the nanowire mesh. From the AFM images it was shown that by increasing the polymer concentration, the nanowire density towards a continuous film at high concentration (2.5 mg/mL) was also increased. For the P3HT nanowire mesh, light scattering and light reabsorption should reach to the maximum when voids between different nanowires are in the order of the wavelength of light. This seems to be the case of P3HT nanowires formed from 0.5 mg/mL polymer solution, while P3HT nanowires formed from 1.0 mg/mL and 2.5 mg/mL solutions are more crowded, with smaller voids around and below 200 nm. The absorption spectra of the P3HT nanowire meshes of varying polymer concentration (0.5, 1.0 and 2.5 mg/mL) was observed. The normalized absorption decreases with increased nanowire density, and this observation confirms that light scattering and light reabsorption decreases with increased nanowire density, e.g. thicker nanowire mesh samples. This has implications on hybrid FET performance. The effect of scattering and reabsorption for the three hybrid graphene-P3HT nanowire mesh FETs by normalizing $\alpha_{NW}$ (ratio of drain current change) to the thickness of P3HT nanowire mesh, d, thus obtaining $$\beta = \frac{\alpha}{d} \times 100\%$$

was compared.

Comparing the thickness-normalized absorption spectra for the 0.5 mg/mL and 1 mg/mL nanowire mesh samples, the 0.5 mg/mL is 2.85 times stronger. Accordingly, a hybrid graphene-P3HT nanowire FET with thickness similar to that of the hybrid graphene-P3HT thin film FET (11 nm here), but with a nanowire density as that of the 0.5 mg/mL sample would outperform the thin film based FET in photoresponsivity 2.85×300%=855%. The measurement indicates that hybrid graphene P3HT nanowire FET with similar thickness but from the 0.5 mg/mL concentrated sample generates a photoresponsivity of around 6000 A/W, or 2× larger than that from the hybrid graphene-P3HT nanowire mesh FET made from the 1.0 mg/mL concentrated sample. Therefore, a photoresponsivity improvement of 600% following a change in polymer morphology from thin film to nanowire mesh was experimentally observed.

X-ray scattering experiments were performed to investigate the crystallinity of the P3HT thin film and of P3HT nanowire mesh samples. The P3HT thin film exhibits a weak and broad peak corresponding to the (1 0 0) plane at 2θ≈5°, while the P3HT nanowire shows a stronger and much sharper peak at (1 0 0) plane at 2θ≈5.4°. For P3HT nanowires, there are two additional peaks corresponding to (2 0 0) plane at 2θ≈10.9° and (3 0 0) plane at 2θ≈16.7°. Thus, X-ray data strongly suggest enhanced packing of alkyl side chain and enhanced crystallinity of P3HT in nanowire vs thin film. While the diffraction peaks corresponding to P3HT lamellae is clearly visible, the peak corresponding to π-π stacking, (020) plain, expected at 2θ≈23° cannot be discerned. Absence of the peak may be indicative of strong orientation of the crystalline domains in respect to the substrate surface. The scans were performed out of sample plain, and will only show crystalline plains oriented parallel to the substrate surface. The difference in crystallinity between P3HT thin films and P3HT nanowires of similar thickness is further demonstrated by grazing-incidence small angle X-ray scattering (GISAXS) measurements. There are clear diffraction patterns for P3HT (1 0 0) in the $q_z$ axis for nanowires, while no such patterns are seen for P3HT thin films. Additionally, only strong diffraction spots are observed along the $q_z$ direction from P3HT nanowires, these results show that crystalline domains are highly oriented in the nanowire mesh samples with lamellae plains parallel to the surface and with π-π stacking direction along the surface. This crystalline orientation is typically referred in the literature as edge-on orientation. In contrast, for the thin films, not only crystallinity is almost absent, but also the alignment of crystallite domains is much weaker compared to nanowire meshes. Generally, grain boundaries between disordered chains, residual doping and other structures or chemical traps can introduce localized trap states in conductive polymers, including P3HT. The enhanced crystallization of P3HT observed by X-ray in the case of nanowires can be responsible for reduced density of trap states. This in turn may lead to enhanced charge mobility in the nanowire vs thin film and, as a result, to improved optoelectronic performance in graphene-P3HT nanowire mesh hybrid FETs. The X-ray diffraction profiles of three P3HT nanowire mesh samples of different polymer concentrations, 0.5, 1 and 2.5 mg/mL to highlight that the intensity of the peak (1 0 0) decreases with increased concentration thickness of the nanowire mesh were observed, indicating that the crystallization decreases in the thicker nanowire mesh mesostructures. This is consistent with the phenomenon that less nanowires are formed in the thicker nanowire mesh mesostructures.

Results

A simple and straightforward method to dramatically improve the optoelectronic properties of hybrid graphene-conductive polymer FETs was demonstrated. Hybrid graphene-P3HT nanowires photodetectors with 600% experimentally observed and 855% theoretically predicted improved spectral photoresponsivity over analogous hybrid devices based on P3HT thin film of similar thickness were observed.

The invention claimed is:

1. A hybrid photodetector comprising atomically thin graphene and a conductive polymer wherein the conductive polymer is poly (3-hexylthiophene) (P3HT) nanowires self-assembled from regioregular P3HT and a mesh-like mesostructure is formed on top of the atomically thin graphene with voids between nanowires in the range of the wavelength of light.

2. The photodetector of claim 1, wherein the P3HT nanowires are about 2-4 µm in length.

3. The photodetector of claim 1, wherein the photodetector comprises no planar P3HT thin film.

4. The photodetector of claim 1, wherein the graphene has a thickness of about 0.33 nm.

5. The photodetector of claim 1, wherein the graphene has a thickness of 0.33 nm and the P3HT nanowires have a thickness of 11 nm.

6. A method of making a hybrid photodetector comprising (1) providing regioregular poly (3-hexylthiophene) (P3HT) and atomically thin graphene; (2) either using a Whiskers method or a mixed solvent method to make the regioregular P3HT self-assemble into P3HT nanowires; and (3) either dropping or spin-casting the P3HT nanowires onto the graphene to form a conductive nanowire mesh hybrid photodetector.

7. The method of claim 6, wherein the mixed solvent method is used and the solvents are chlorobenzene and acetone.

8. The method of claim 7, wherein the regioregular P3HT is dissolved in chlorobenzene to form a solution then heated for at least 3 hours; acetone is added to the solution with stirring to form a mixed solution; and the mixed solution is stirred and heated for at least 10 hours then cooled to room temperature.

9. The method of claim 8, wherein the ratio of chlorobenzene to acetone is about 3:1.

10. The method of claim 8, wherein the solution is heated to about 95° C. and the mixed solution is heated to about 90° C.

11. The method of claim 7, wherein the P3HT nanowires are present in the solvents in a concentration of about 0.5 to about 2.5 mg/ml.

12. The method of claim 6, wherein spin-casting is used and the spin-casting occurs at about 1500 rpm to about 2500 rpm.

* * * * *